(12) United States Patent
Shafer

(10) Patent No.: US 11,248,289 B2
(45) Date of Patent: Feb. 15, 2022

(54) MULTILAYERED CORROSION AND ANTI-GALLING COATING FOR THREADS AND WEARABLE MATERIALS

(71) Applicant: Dallas Thin Films, Corsicana, TX (US)

(72) Inventor: Steven Craig Shafer, Corsicana, TX (US)

(73) Assignee: DALLAS THIN FILMS, Corsicana, TX (US)

( * ) Notice: Subject to any disclaimer, the term of this patent is extended or adjusted under 35 U.S.C. 154(b) by 664 days.

(21) Appl. No.: 16/049,532

(22) Filed: Jul. 30, 2018

(65) Prior Publication Data

US 2019/0144985 A1 May 16, 2019

Related U.S. Application Data

(60) Provisional application No. 62/584,538, filed on Nov. 10, 2017.

(51) Int. Cl.
| | |
|---|---|
| *F16L 58/08* | (2006.01) |
| *F16L 58/18* | (2006.01) |
| *C23C 14/02* | (2006.01) |
| *C23C 14/08* | (2006.01) |
| *C23C 14/18* | (2006.01) |
| *F16B 33/00* | (2006.01) |
| *C23C 14/16* | (2006.01) |
| *E21B 17/042* | (2006.01) |
| *C23C 28/00* | (2006.01) |
| *F16B 33/06* | (2006.01) |
| *B05D 5/08* | (2006.01) |

(52) U.S. Cl.
CPC ............ *C23C 14/025* (2013.01); *C23C 14/08* (2013.01); *C23C 14/16* (2013.01); *C23C 14/18* (2013.01); *C23C 28/321* (2013.01); *C23C 28/322* (2013.01); *C23C 28/3455* (2013.01); *E21B 17/042* (2013.01); *F16B 33/008* (2013.01); *F16B 33/06* (2013.01); *F16L 58/08* (2013.01); *F16L 58/182* (2013.01); *B05D 5/08* (2013.01)

(58) Field of Classification Search
CPC ..... C23C 14/024; C23C 14/025; C23C 14/08; C23C 14/083; F16L 58/08
See application file for complete search history.

(56) References Cited

U.S. PATENT DOCUMENTS

| | | | | |
|---|---|---|---|---|
| 4,468,309 | A | * 8/1984 | White | C23C 14/32 427/528 |
| 2004/0038068 | A1 | * 2/2004 | Finch | C23C 14/0015 428/626 |
| 2010/0266790 | A1 | * 10/2010 | Kusinski | B32B 5/26 428/34.6 |
| 2014/0362434 | A1 | * 12/2014 | Schmitz | C03C 17/366 359/350 |
| 2018/0282153 | A1 | * 10/2018 | Heller | H01L 23/02 |

FOREIGN PATENT DOCUMENTS

JP 2002254206 A * 9/2002

OTHER PUBLICATIONS

Sato et al., JP 2002254206, Sep. 10, 2002 (Machine translation, Abstract only) (Year: 2002).*

* cited by examiner

*Primary Examiner* — Cheng Yuan Huang

(57) ABSTRACT

A multilayered corrosion and anti-galling coating for threads and wearable materials is a liner that can be superimposed onto the surface of a device in order to protect the surface from environmental hazards. To accomplish this, the coating has a base adhesive layer, an intermediary insulation layer, an interstitial adhesive layer, and a lubricating material layer. The base adhesive layer adheres to the device's surface thus enabling the coating to form a sealing liner. The intermediary insulation layer is positioned in between the base adhesive layer and the interstitial adhesive layer. As a result, the intermediary insulation layer prevents negative chemical interactions between the base adhesive layer and the interstitial adhesive layer. The lubricating material layer is super imposed onto the interstitial adhesive layer to provide a friction-reducing coating for the device's surface.

1 Claim, 2 Drawing Sheets

MULTILAYERED CORROSION AND ANTI-GALLING COATING FOR THREADS AND WEARABLE MATERIALS

The current application claims a priority to the U.S. Provisional Patent application Ser. No. 62/584,538 filed on Nov. 10, 2017.

FIELD OF THE INVENTION

The present invention relates generally to a surface treatment. More specifically, the present invention relates to a multilayered coating that reduces friction, corrosion, and galling damage.

BACKGROUND OF THE INVENTION

The present invention, the multilayered corrosion and anti-galling coating for threads and wearable materials, is a coating that acts as an abrasive and adhesive wear protection. Further, the present invention acts as a corrosion and friction reducing coating. This functionality of the present invention prevents two interlocking devices from wear caused by galling, corrosion, and erosion. The coating is produced by first applying an adhesion layer of titanium or chrome to the surface of a device. A second layer of Hafnium oxide is then applied over the titanium or chrome layer. A third layer that is composed of chrome is then applied on top of the hafnium oxide layer. Finally, a fourth layer that is gold is applied on top of the third chrome layer. This fourth layer acts as a lubrication layer to prevent galling and cold bonding of the two interlocking devices when the devices are composed of metal. Preferably, the layers of the coating are applied in an ultra-high vacuum chamber and deposited using electron e-beam ion mill assisted deposition. The coating is developed for oil field pipe threads, off shore drilling pipe or any threads or materials that may wear or have galling issues or may be subject to a corrosive environment such as hydrogen sulfides.

DETAIL DESCRIPTIONS OF THE INVENTION

All illustrations of the drawings are for the purpose of describing selected versions of the present invention and are not intended to limit the scope of the present invention.

Figure 1:
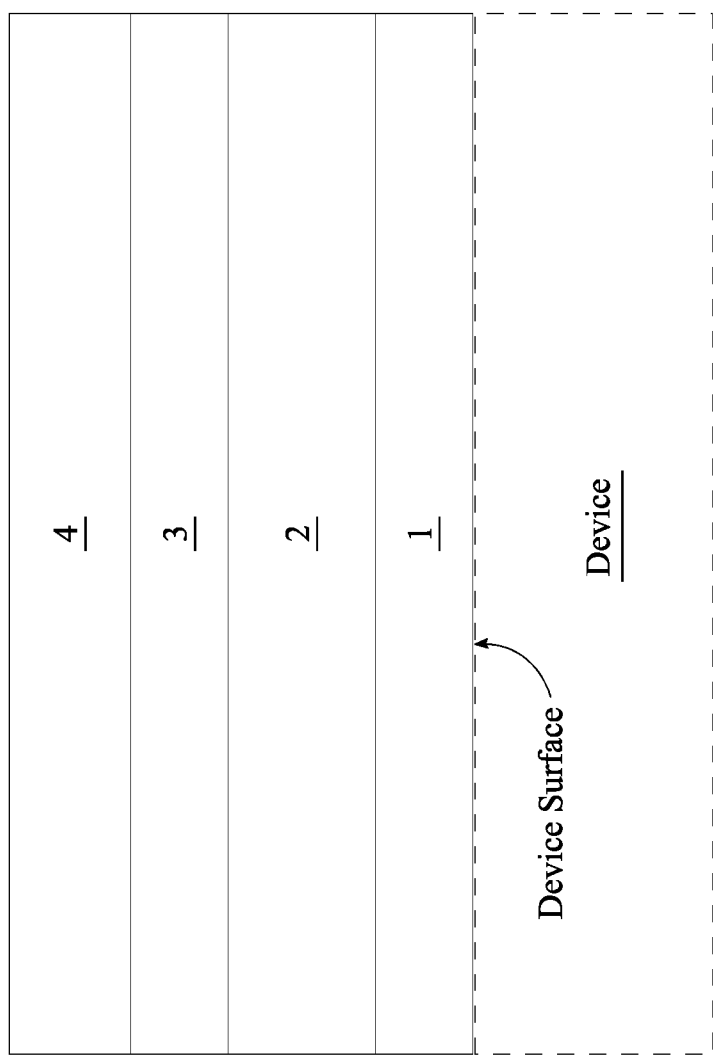
FIG. 1 is a block diagram showing the arrangement of the layers in relation to the device surface used in the present invention.
Figure 2:
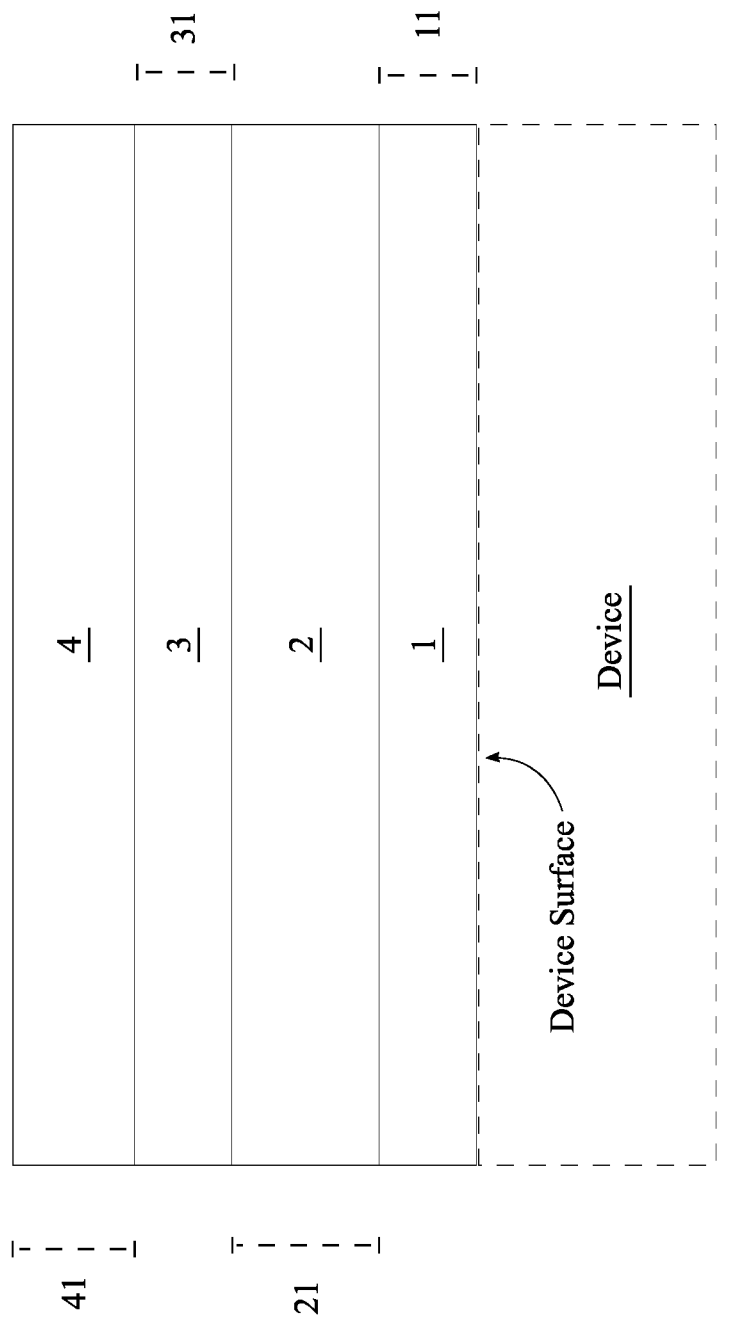
FIG. 2 is a block diagram showing the various thicknesses of the layers used in the present invention.

In reference to FIG. 1 and FIG. 2, the present invention, a multilayered corrosion and anti-galling coating for threads and wearable materials, is a material that can be applied to the surface of a device in order to reduce damage from the environment, friction, and friction-related wear. To achieve this, the present invention makes use of multiple layers of materials that are sequentially deposited onto the device's surface. Specifically, the present invention comprises a base adhesive layer 1, an at least one intermediary insulation layer 2, an at least one interstitial adhesive layer 3, and an at least one lubricating material layer 4. Each of these layers work in concert to provide a coating that reduces damage to the surface of the device, which is caused by environment factors. Preferably the present invention is applied to the surface of interlocking threaded connectors. Thus applied, the present invention prevents damage to the threaded connectors while the connectors are engaged or disengaged. The base adhesive layer 1 is a material that is designed to adhere to the surface of the device. As such, the base adhesive layer 1 is superimposed onto the surface of the device. Preferably the base adhesive later is composed of chrome. Alternatively, the base adhesive layer 1 can be composed of titanium, a chrome-titanium mixture, or various other adhesive materials capable of bonding the present invention to the surface of the device.

In reference to FIG. 1 and FIG. 2, the arrangement of the layers enables the present invention to make use of materials that would otherwise have negative interactions. Specifically, the present invention makes use of the intermediary insulation layer 2 to isolate the materials of layers which have undesirable interactions. As such, the intermediary insulation layer 2 is superimposed onto the base adhesive layer 1. Additionally, the interstitial adhesive layer 3 is superimposed onto the intermediary insulation layer 2, opposite to the base adhesive layer 1. As a result, the intermediary insulation layer 2 prevents any chemical interaction between the base adhesive layer 1 and the interstitial adhesive layer 3. Preferably the intermediary insulation layer 2 is composed of hafnium oxide. However, the present invention can use various insulating materials to produce the intermediary insulation layer 2.

In reference to FIG. 1 and FIG. 2, the uppermost layer of the present invention is designed to act as a lubricant. Specifically, the lubricating material layer 4 is superimposed onto the interstitial adhesive layer 3, opposite to the intermediary insulation layer 2. Accordingly, the present invention acts as a liner which prevents the surface of the device form making direct contact with the external environment. Thus, enabling the lubricating material layer 4 to reduce the friction coefficient of the surface of the device. Preferably the lubricating material layer 4 is composed of gold. The present invention makes use of this multilayered structure to form a sealant that protects the surface of the device from corrosion and various other forms of damage caused by hazards in the external environment. Additionally, the present invention is designed with layers of sufficient thickness to protect the surface of the device in an efficient manner.

In reference to FIG. 1 and FIG. 2, preferably, a thickness 11 of the base adhesive layer 1 and a thickness 31 of the interstitial adhesive layer 3 is less than a thickness 21 of the intermediary insulation layer 2. Further, a thickness 41 of the lubricating material layer 4 is less than the thickness 31 of the interstitial adhesive layer 3. Preferably, the base adhesive layer 1 is 1200 to 1800 angstroms thick, the intermediary insulation layer 2 is 12,000 to 15,000 angstroms thick, the interstitial adhesive layer 3 is 1,200 to 1,800 angstroms thick, and the lubricating material layer 4 is 350 to 400 angstroms thick. An alternative embodiment of the present invention may use additional layers that are stacked onto or interspersed in between the above-described layers. These embodiments comprise layers of material that add desirable surface-protecting features to the present invention.

Although the invention has been explained in relation to its preferred embodiment, it is to be understood that many other possible modifications and variations can be made without departing from the spirit and scope of the invention as hereinafter claimed.

What is claimed is:

1. A multilayered corrosion and anti-galling coating for threads and wearable materials comprising:

a base adhesive layer composed of a material selected from chrome or a mixture of titanium and chrome;
an intermediary insulation layer;
an interstitial adhesive layer composed of a material selected from chrome or a mixture of titanium and chrome;
an lubricating material layer;
the intermediary insulation layer being superimposed onto the base adhesive layer;
the interstitial adhesive layer being superimposed onto the intermediary insulation layer, opposite to the base adhesive layer;
the lubricating material layer composed of gold being superimposed onto the interstitial adhesive layer, opposite to the intermediary insulation layer;
a thickness of the base adhesive layer;
a thickness of the intermediary insulation layer;
a thickness of the interstitial adhesive layer;
a thickness of the lubricating material layer;
the thickness of the base adhesive layer, the thickness of the interstitial adhesive layer and the thickness of the lubricating material layer each being less than the thickness of the intermediary insulation layer;
the thickness of the base adhesive layer being 1200 to 1800 angstroms;
the thickness of the intermediary insulation layer being 12000 to 15000 angstroms;
the thickness of the interstitial adhesive layer being 1200 to 1800 angstroms; and
the thickness of the lubricating material layer being 350 to 400 angstroms.

* * * * *